United States Patent [19]

Itoyama et al.

[11] Patent Number: 6,066,796
[45] Date of Patent: May 23, 2000

[54] SOLAR CELL MODULE

[75] Inventors: Shigenori Itoyama; Akiharu Takabayashi, both of Nara; Satoru Shiomi; Hidehisa Makita, both of Kyotanabe, all of Japan

[73] Assignee: Canon Kabushiki Kaisha, Tokyo, Japan

[21] Appl. No.: 09/021,943

[22] Filed: Feb. 11, 1998

[30] Foreign Application Priority Data

Feb. 14, 1997 [JP] Japan .................................. 9-030534

[51] Int. Cl.[7] .................................................. H01L 25/00
[52] U.S. Cl. ............................................................ 136/251
[58] Field of Search ............................................ 136/251

[56] References Cited

U.S. PATENT DOCUMENTS 5,273,593 12/1993 Marquardt et al. ..................... 136/251
5,280,133 1/1994 Nath ........................................ 136/251
5,650,019 7/1997 Yamada et al. ........................ 136/251

*Primary Examiner*—Mark Chapman
*Attorney, Agent, or Firm*—Fitzpatrick, Cella, Harper & Scinto

[57] ABSTRACT

A terminal exposed from an edge of a solar cell module to extract power from a photovoltaic element, and a conductive member of a cable are electrically connected to each other. The solar cell module has at least photovoltaic elements and a cover member that covers the photovoltaic elements. This electrical connecting portion is located in a fixing member that fixes the cable and the solar cell module to each other. The long-term reliability of the terminal extraction portion is improved, and the solar cell module can be installed easily.

17 Claims, 8 Drawing Sheets

SOLAR CELL MODULE

BACKGROUND OF THE INVENTION

1. Field of the Invention

The present invention relates to a solar cell module having an improved terminal box structure.

2. Related Background Art

Figure 10:
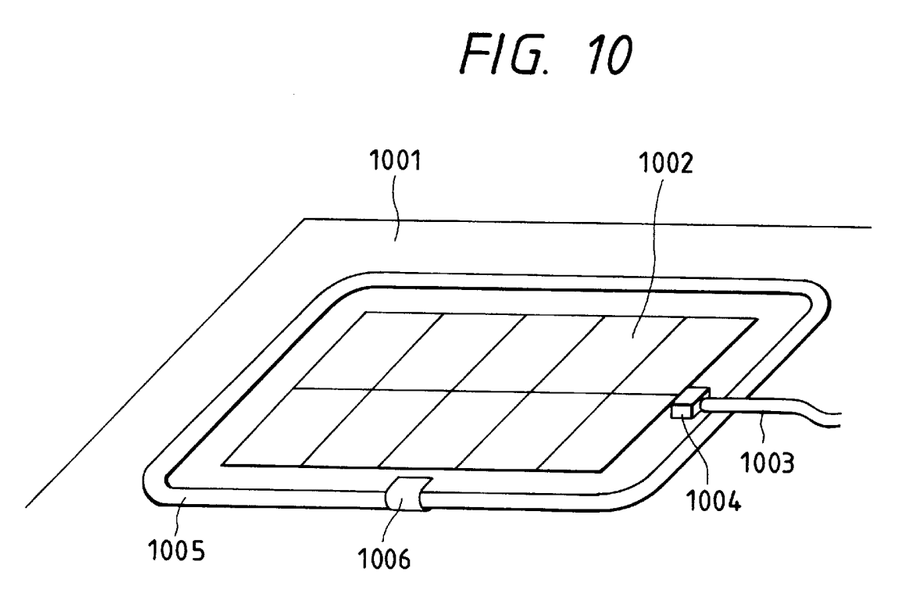
FIG. 10 is a schematic view of another conventional example as Comparative Example 1.

Various installation places and methods for a flexible thin film solar cell module are available. FIG. 10 shows an example of a conventional flexible solar cell module. Referring to FIG. 10, reference numeral 1001 denotes an installing surface; 1002, photovoltaic elements; 1003, a cable; and 1004, a terminal box. The photovoltaic elements 1002 are provided with an edge cover 1005 serving as an edge protective member for protecting their edges. The two ends of the edge protective member are connected to each other with an edge cover connecting member (an fixing member) 1006 and are simultaneously fixed to the solar cell module.

This terminal extracting method utilizing a terminal box is generally used for a roof solar cell module, a ground solar cell module, and the like in addition to a roofing material integrated solar cell module. When a solar cell module is to be installed by adhering it to an installing surface, since the terminal box is a projection, it must be fixed to the light-incident side so that it will not interfere with the adhesion surface. FIG. 10 shows an example wherein the terminal box is fixed to the light-incident side in this manner.

When, however, a solar cell module is adhered to a building in this state, the terminal box portion tends to peel. Since the solar cell module requires weather resistance, the cover member of the terminal box adhesion surface often uses a fluoroplastic, leading to an insufficient reliability at the terminal box adhesion portion. Since the terminal box projects from the surface, it can be easily damaged.

Figure 9A:
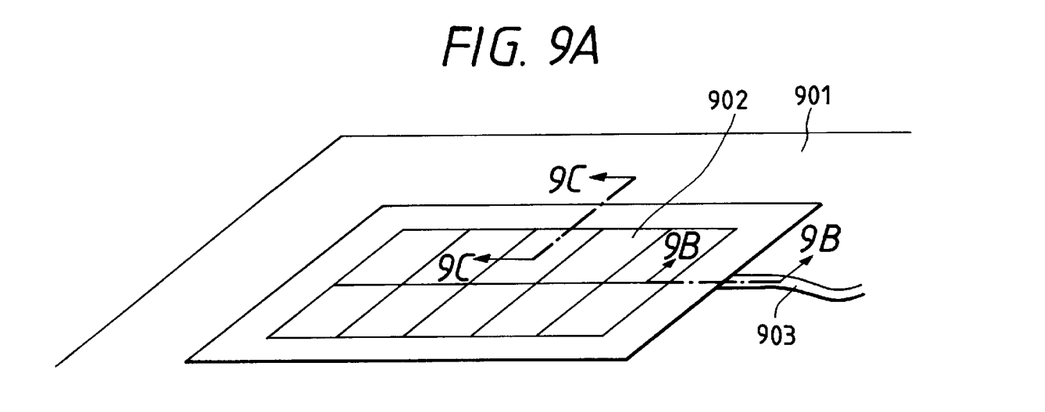
FIG. 9A is a schematic view showing a state wherein the solar cell module is fixed to an automobile roof.
Figure 9B:
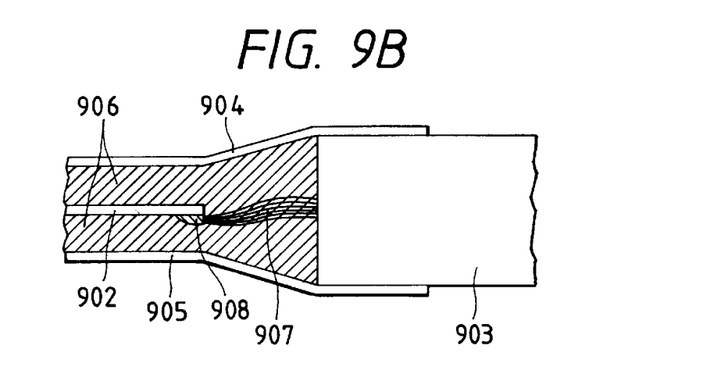
FIG. 9B is a sectional view of the solar cell module taken along the line 9B—9B of FIG. 9A.
Figure 9C:
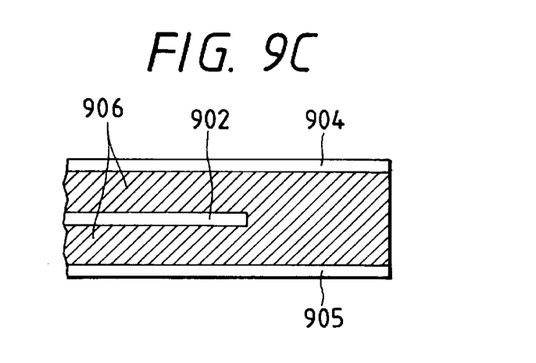
FIG. 9C is a sectional view of the solar cell module taken along the line 9C—9C of FIG. 9A.

FIGS. 9A to 9C show a case wherein, as a countermeasure against terminal box peeling, a solar cell module is fixed to the automobile roof by extracting a terminal without using a terminal box. FIG. 9A is a schematic view of the solar cell module, FIG. 9B is a sectional view of the module taken along the line 9B—9B of FIG. 9A, and FIG. 9C is a sectional view of the module taken along the line 9C—9C of FIG. 9A.

Referring to FIGS. 9A to 9C, reference numeral 901 denotes an installing surface; 902, photovoltaic elements; 903, a cable; 904, an upper cover member; 905, a lower cover member; 906, a filler; 907, an in-cable copper wire; and 908, a solder portion, respectively. As a countermeasure against terminal box peeling, the terminal is extracted not through a terminal box, but is directly extracted from the end portion of the module by connecting a lead-in cable directly to the photovoltaic element, as shown in FIG. 9B.

At the terminal extraction portion in the end portion of the solar cell module, since the cover member partly constituting the solar cell module is adhered with a stress, the upper cover member 904 and filler 906, or the lower cover member 905 and filler 906 gradually peel from each other over a long-term use. At the terminal extraction portion, the cable 903 is directly inserted in the filler 906. The cable 903 and filler 906 may also undesirably peel from each other.

In FIG. 9B, the cable 903 is inserted in the filler 906 directly from the end portion of the solar cell module. The cable has a copper wire in its insulating cover member. The interface between the insulated cover member and the inner copper wire tends to pass moisture, that has entered the cable, through it. With the structure of FIG. 9B, when the moisture should enter the cable over a long-term use, it tends to enter the solar cell module along the cable. In this case, the long-term reliability may suffer.

When a terminal box is arranged on the lower surface of the solar cell module, the workability is poor when installing the solar cell module to the roof of a building structure or automobile.

SUMMARY OF THE INVENTION

It is an object of the present invention to provide a solar cell module in which the terminal extraction portion is not easily influenced by the environment so that the reliability is improved, thereby improving the installation workability.

According to the present invention, there is provided a solar cell module comprising a photovoltaic element covered with a cover member and a terminal exposed from an edge of the solar cell module to extract power generated by the photovoltaic element; wherein a cable and the terminal are electrically connected in a fixing member that fixes the cable with the solar cell module.

BRIEF DESCRIPTION OF THE DRAWINGS

FIGS. 3A, 3B and 3C are schematic views of an edge protective member partly constituting the solar cell module of the present invention, in which

FIGS. 4A, 4B and 4C are schematic views of a fixing member partly constituting the solar cell module of the present invention, in which

FIGS. 8A, 8B and 8C are views for explaining Example 2 of the present invention, in which

FIGS. 9A, 9B and 9C are schematic views of a conventional solar cell module as Comparative Example 2, in which

DETAILED DESCRIPTION OF THE PREFERRED EMBODIMENTS

Figure 1A:
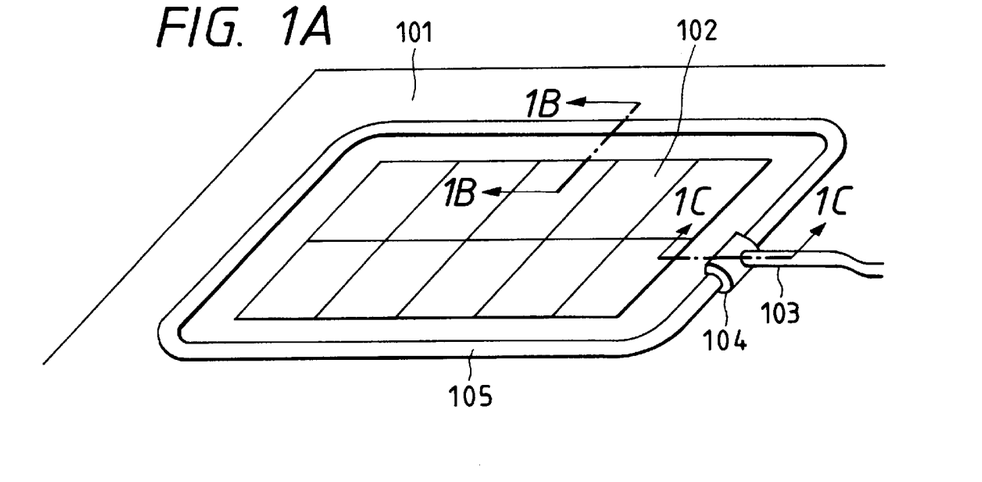
FIG. 1A is a perspective view of a solar cell module according to the present invention.
Figure 1B:
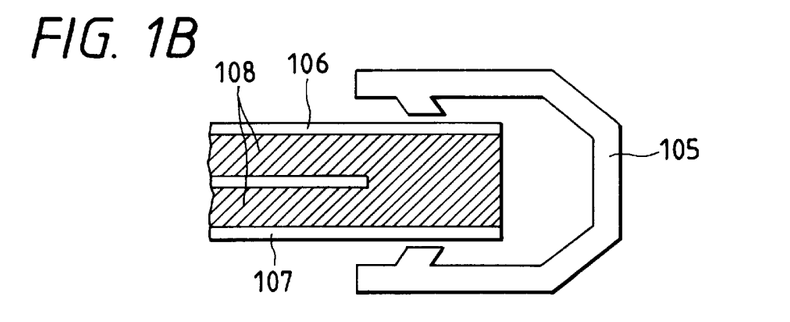
FIG. 1B is a sectional view taken along the line 1B—1B of FIG. 1A.
Figure 1C:
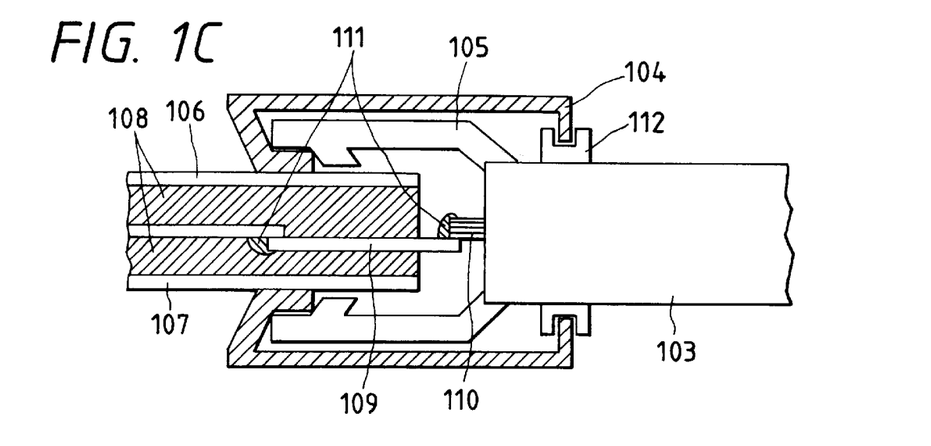
FIG. 1C is a sectional view taken along the line 1C—1C of FIG. 1A.

FIG. 1A is a perspective view of a solar cell module according to the present invention, FIG. 1B is a sectional view of the module taken along the line 1B—1B of FIG. 1A, and FIG. 1C is a sectional view of the module taken along the line 1C—1C of FIG. 1A. Reference numeral 101 denotes an installing surface; 102, photovoltaic elements; 103, a cable; 104, a fixing member for fixing the cable 103 to the solar cell module; 105, an edge protective member; 106, an upper cover member; 107, a lower cover member; 108, a filler; 109, a copper foil for electrode extraction; 110, an in-cable copper wire; 111, solder portions; and 112, a bushing.

As shown in FIGS. 1A to 1C, the fixing member of the solar cell module has a terminal extraction structure.

[Edge Protective Member]

As the quality required for the edge protective member, preferably, the edge protective member must be able to clamp the end portion of the solar cell module and is made of a material having long-term durability, thermal expansion resistance, and heat shrinkage resistance.

Figure 3A:
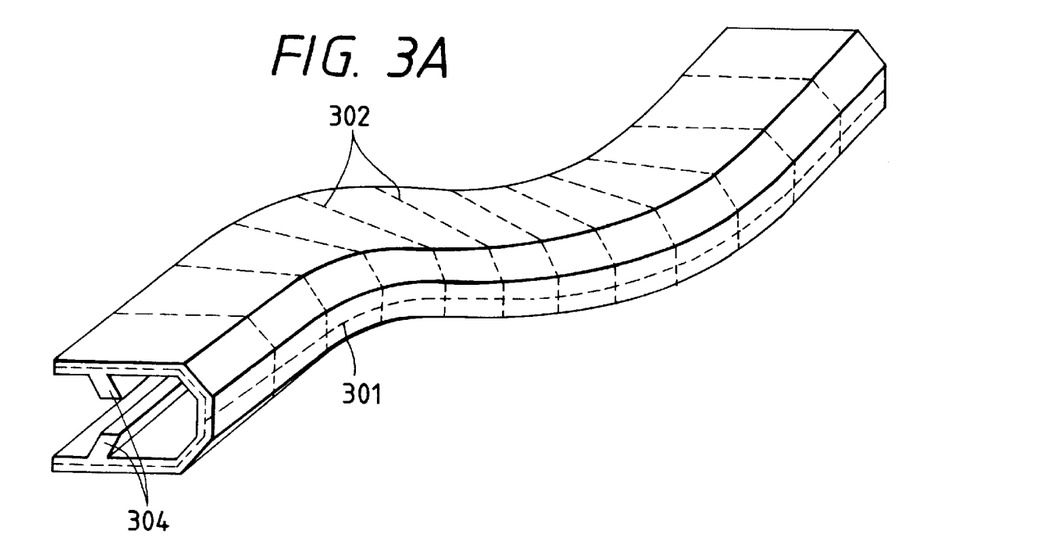
FIG. 3A is an overall perspective view.
Figures 3B, 3C:
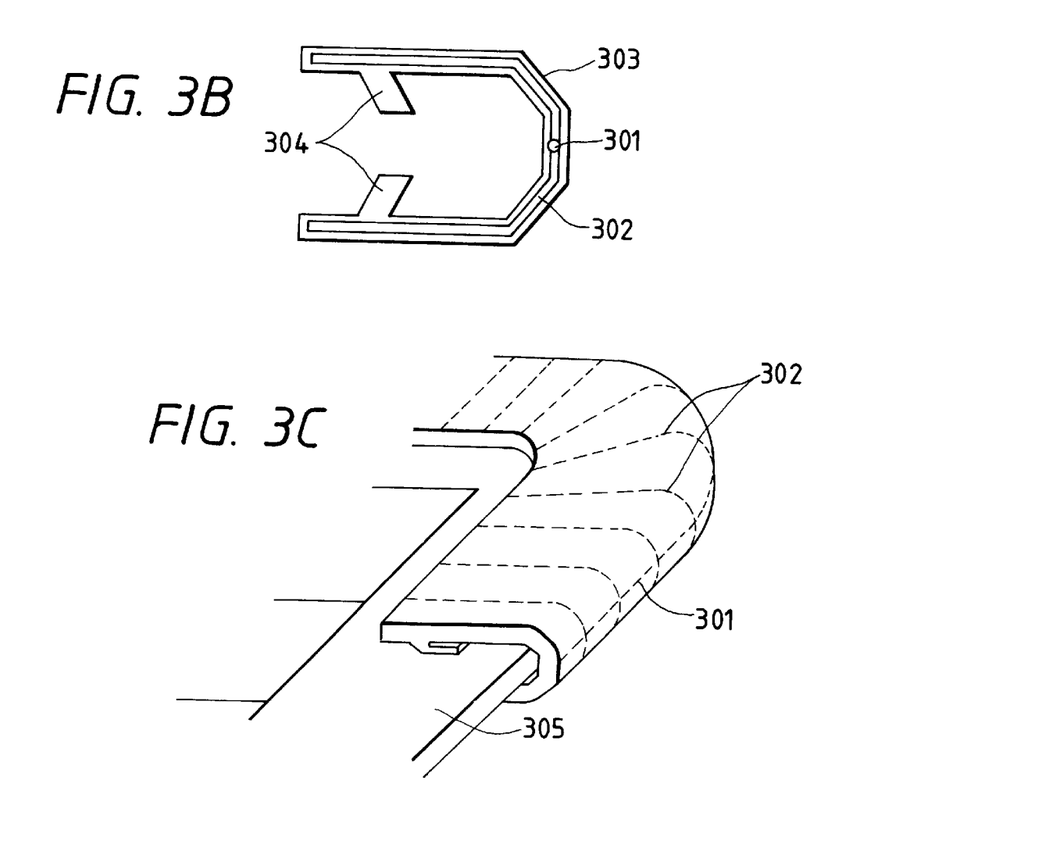
FIG. 3B is a schematic sectional view.
FIG. 3C is a schematic view showing a state wherein the edge protective member covers the edge of the solar cell module.

FIGS. 3A to 3C are schematic views of the edge protective member, in which FIG. 3A is an overall perspective view, FIG. 3B is a schematic sectional view, and FIG. 3C is a schematic view showing a state wherein the edge protective member covers the edge of the solar cell module. As shown in FIGS. 3A to 3C, an edge protective member 303 has a wire extending in the longitudinal direction and/or a direction perpendicular to it, i.e., a backbone member 301 and aggregates 302 perpendicular to the backbone member 301. The aggregates are arranged at a predetermined pitch. With this arrangement, the edge protective member 303 can have a flexible shape. When a solar cell module 305 is fitted in the edge protective member 303, the end portion of the solar cell module 305 can be covered.

Because of the presence of weather protectors 304, the end portion of the solar cell module 305 is not easily influenced by the environment, e.g., by rain, sand, or salt. Even if the material constituting the solar cell module 305 should peel from the end portion of the solar cell module, progress of this peeling can be suppressed because the weather protectors 304 clamp the end portion of the solar cell module 305. In FIG. 3C, the edge protective member 303 covers the corner portion of the solar cell module 305. The edge protective member 303 does not spread but clamps the corner portion of the solar cell module 305 well. This is because the aggregates 302 in the edge protective member 303 clamp the solar cell module 305. When the corner portion of the solar cell module has an appropriate curve in this manner, the edge of the corner portion can be covered.

As the material of the edge protective member 303, for example, PVC, EPDM rubber, or the like can be used. As the backbone member 301 and aggregates 302, a metal material, e.g., iron or aluminum, can be used. The structure and shape of the edge protective member 303 are not limited to those described above. As far as the edge protective member 303 can clamp the end portion of the solar cell module, the backbone member or aggregates may be omitted.

[Fixing Member]

Figure 4A:
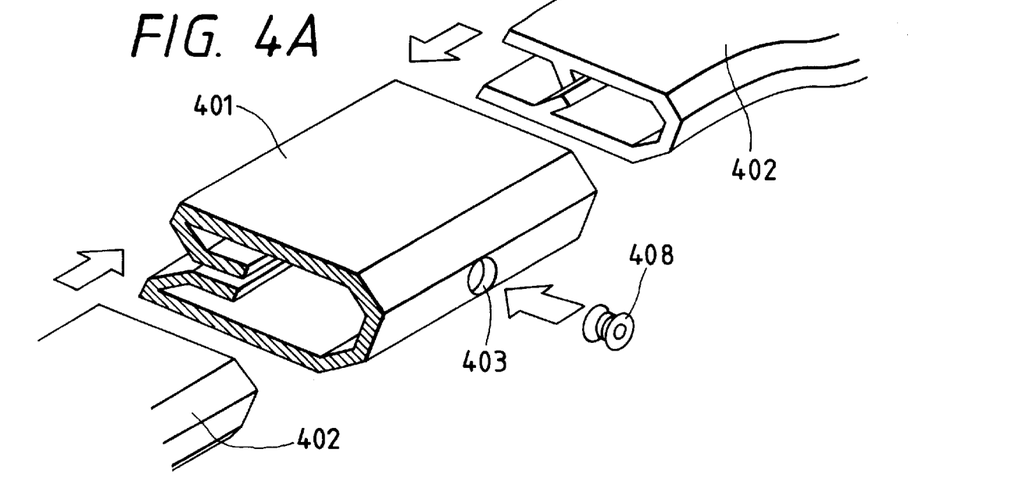
FIG. 4A is a schematic view for explaining how to assemble the edge protective member and the fixing member together.
Figure 4B:
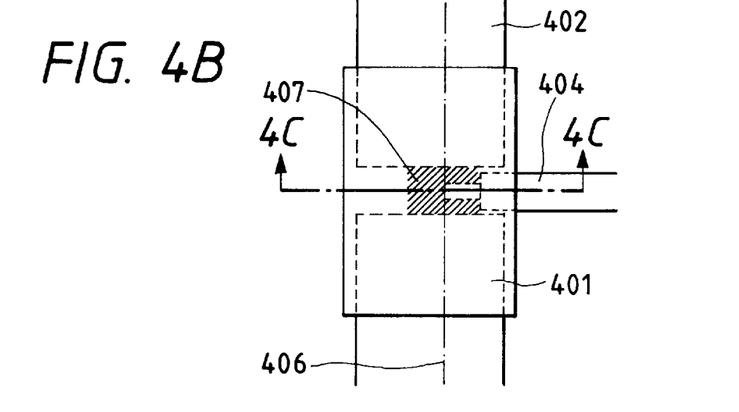
FIG. 4B is a plan view of a portion where the edge protective member and fixing member are assembled together.
Figure 4C:
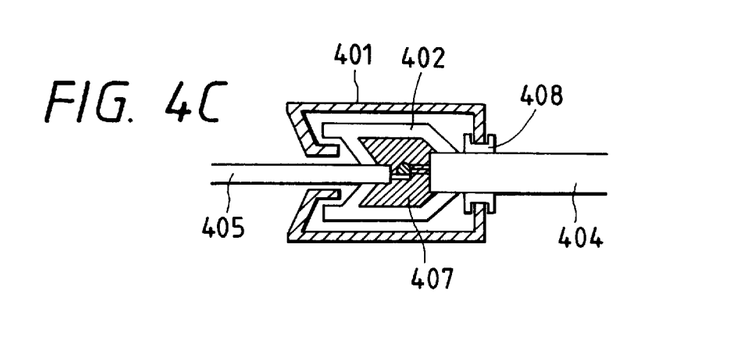
FIG. 4C is a sectional view of the structure taken along the line 4C—4C of FIG. 4B.

FIGS. 4A to 4C are schematic views for explaining a fixing member, in which FIG. 4A is a schematic view for explaining how to assemble the edge protective member and the fixing member together, FIG. 4A is a plan view of a portion where the edge protective member and fixing member are assembled together, and FIG. 4C is a sectional view of the structure taken along the line 4C—4C of FIG. 4I.

Referring to FIGS. 4A to 4C, reference numeral 401 denotes a fixing member; 402, an edge protective member; 403, a cable extraction hole; 404, a cable; 405, a solar cell module; 406, an end portion (trimming portion) of the solar cell module 405; 407, a sealant material; and 408, a bushing.

As shown in FIGS. 4A to 4C, when the edge protective member 402 is inserted in the fixing member 401, the edge protective member 402 is connected, and the cable 404 and the solar cell module 405 can be mechanically fixed to each other. Also, the electrical connecting portion is protected. The lead-in cable 404 serving to extract the terminal of the solar cell module 405 can be extracted from the lead-in cable extraction hole 403 in the fixing member 401 through the bushing 408. When the bushing is used in this manner, the terminal extraction portion can have a structure resistant to the environment.

As shown in FIGS. 4B and 4C, at the terminal extraction portion, a gap is undesirably formed between the connecting portions of the edge protective member 402. Accordingly, it is preferable to fill the portion between the connecting portions of the edge protective member 402, i.e., to fill the fixing member 401, with a sealant material or the like. This enables the edge protective member 402 to be less influenced by the environment, e.g., rain, sand, or salt. As the material of the fixing member 401, one similar to that of the edge protective member 402 can be used.

[Solar Cell Module]

As the solar cell module according to the present invention, one in which photovoltaic elements are sealed with a resin and the upper and lower surfaces of which are covered with films is preferably used. As the photovoltaic elements, those using non-single-crystal semiconductor are particularly desirable since they have flexibility. However, a solar cell module having a glass substrate can also be employed.

Figure 2:
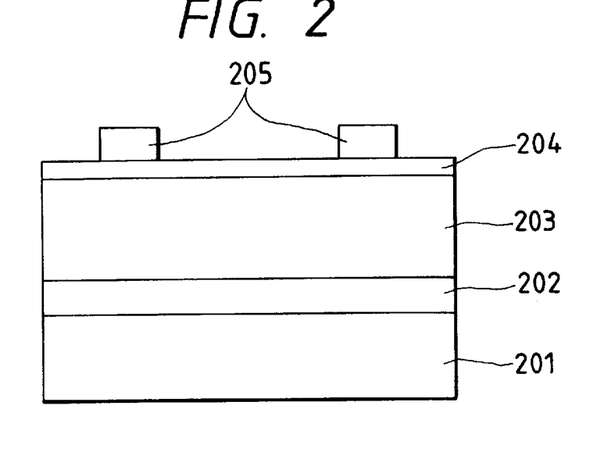
FIG. 2 is a schematic view showing the arrangement of a photovoltaic element partly constituting the solar cell module of the present invention.

FIG. 2 shows an example of a photovoltaic element. Reference numeral 201 denotes a conductive substrate; 202, a metal layer; 203, a semiconductor layer; 204, a transparent conductive layer; and 205, collector electrodes, respectively.

(Substrate)

As the material of the substrate, a metal, a resin, glass, a ceramic material, a semiconductor bulk, or the like is used. The surface of the substrate may have small recesses and projections. A transparent substrate may be used, and light may be incident from the substrate. Stainless steel, a polyimide resin, or the like is particularly preferable because it has flexibility.

(Metal Layer)

The metal layer serves as an electrode and as a reflecting layer for reflecting light, which has reached the substrate, to be reutilized by the semiconductor layer. To form the metal layer, Al, Cu, Ag, Au, or the like is formed by vapor deposition, sputtering, plating, printing, or the like. Since the metal layer has recesses and projections on its surface, it can increase the optical path length of the reflected light in the semiconductor layer, thereby increasing the short-circuit current.

If the substrate has conductivity, the metal layer need not be formed. A plurality of metal layers may be formed. A transparent conductive layer may be formed between the metal layer and the semiconductor layer.

(Semiconductor Layer)

As the material of the semiconductor layer, a pn junction, a pin junction, or a Schottky junction of a silicon or compound semiconductor is used. In particular, a pin junction of amorphous or crystallite Si, C, or Ge, or an alloy of Si, C, or Ge is suitably used as the film is thin. At the same time, the semiconductor layer contains hydrogen and/or halogen atoms. The preferable content of the hydrogen and/or halogen atoms is 0.1 atm % to 40 atm %. The semiconductor layer may also contain oxygen, nitrogen, or the like. The impurity concentration of oxygen, nitrogen, or the like is preferably equal to or less than $5 \times 10^{19} cm^{-3}$.

A stacked cell having a plurality of pin junctions may be employed. In this case, the i-type semiconductor layer of the pin junction close to the light-incident side preferably has a wide band gap, such that farther from the pin junction, the narrower the band gap. In the i-layer, the minimal value of the band gap is preferably present closer to the p-layer than at the center of the layer thickness.

As the doped layer on the light-incident side, a crystal semiconductor having small optical absorption or a semiconductor having a wide band gap is suitable.

To form the semiconductor layer described above, microwave (MW) plasma CVD or high-frequency (RF) plasma CVD is suitable.

(Transparent Electrode)

When the thickness of the transparent electrode is appropriately set, the transparent electrode can also serve as a reflection preventive film.

The transparent electrode is formed of a material, e.g., ITO, ZnO, $InO_3$, or the like in accordance with vapor deposition, CVD, spray coating, spin-on coating, dipping, or the like. These compounds may contain a material that changes the conductivity.

(Collector Electrode)

The collector electrodes are formed to improve the electricity collecting efficiency. To form the collector electrodes, a metal may be formed into an electrode pattern in accordance with sputtering by using a mask, a conductive paste or solder paste may be printed, or a metal wire may be fixed with a conductive paste.

The photovoltaic elements described above are sealed with the filler, and cover members are applied to their upper and lower surfaces.

[Upper Cover Member]

The upper cover member is required to have high transparency and high weather resistance, and to be difficult to contaminate. Glass may be used as the upper cover member. However, if a film is used as the upper cover member, the filler can fill the upper cover member better, and the upper cover member can be made lightweight and will not be broken with an impact. Moreover, if the surface of the film is embossed, sunlight reflected by the surface of the cover member becomes non-glaring. Examples of the material of the upper cover member are fluoroplastic films of polyethylene tetrafluoroethylene (ETFE), polyethylene trifluoride, and polyvinyl fluoride. However, the present invention is not limited to them. The adhesion surface of the upper cover member where the filler is to be adhered may be subjected to a surface treatment, e.g., corona discharge, so that the filler can be easily adhered to it.

[Filler]

The filler is required to have high weather resistance, high thermoplasticity, high heat adhesion properties, and high optical transmission properties. Examples of the material of the filler are transparent resins, e.g., EVA (vinyl acetate-ethylene copolymer), a butyral resin, a silicone resin, an epoxy resin, and a fluorinated polyimide resin. However, the present invention is not limited to them. Crosslinking is possible if a crosslinker is added to the filler. An ultraviolet absorbing agent is preferably contained in the filler in order to suppress deterioration by light.

[Lower Cover Member]

The lower cover member is used to maintain electrical insulation between the photovoltaic elements and the outside by covering the lower surface of the solar cell module. The lower cover member is preferably made of a flexible material which can ensure excellent electrical insulation, which has long-term durability, and which is resistant to impact, scratching, thermal expansion, and thermal shrinkage. Examples of the material which can be suitably used are plastic films made of nylon, polyethylene terephthalate (PET), and the like.

A metal steel sheet may be used as the lower cover member as well. As the material of the steel sheet, for example, a stainless steel sheet, a plated steel sheet, or a galvanized steel sheet may be used. However, the present invention is not limited to these materials. In this case, it is difficult to maintain electrical insulation between the photovoltaic elements and the outside. Therefore, an insulating film is interposed between the photovoltaic elements and the steel sheet, thereby constituting the lower cover member. As the insulating film, a plastic film made of, e.g., nylon or polyethylene terephthalate (PET) can be used.

[Installation Method for Solar Cell Module]

Since the solar cell module according to the present invention has no projection on its lower surface, it can be fixed to the installing surface in accordance with various methods. For example, the solar cell module can be fixed with a double-coated tape, an adhesive, or the like. A magnet may also be used. In this case, the magnet may be fixed to the lower cover member with an adhesive or is buried in the filler. A rubber magnet having flexibility is suitable.

EXAMPLES

Example 1

An amorphous silicon (a-Si) solar cell module was fabricated. The fabricating procedure for this will be described with reference to FIG. 5. An Al layer (with a thickness of 5,000 Å) and a ZnO layer (with a thickness of 5,000 Å) were sequentially formed as a lower metal electrode layer 502 by sputtering on a cleaned stainless steel substrate 501.

Figure 5:
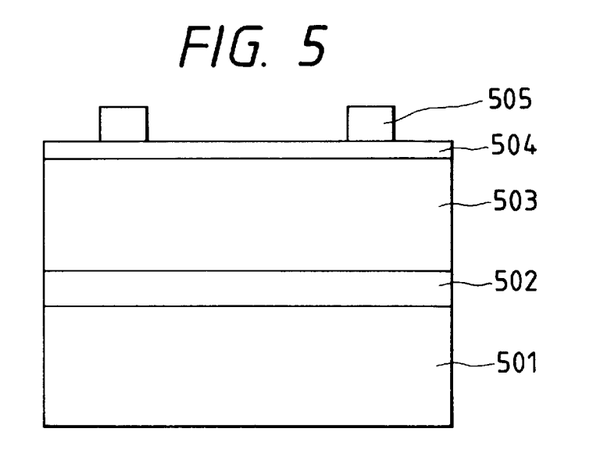
FIG. 5 is a schematic view showing the arrangement of a photovoltaic element partly constituting a solar cell module according to Example 1 of the present invention.

Subsequently, in accordance with plasma CVD, an n-type a-Si layer, an i-type a-Si layer, and a p-type crystallite μc-Si layers were formed from a gas mixture of $SiH_4$ a $PH_3$, and $H_2$, a gas mixture of $SiH_4$ and $H_2$, and a gas mixture of $SiH_4$, $BF_3$, and $H_2$, respectively, to form a tandem a-Si photoelectric conversion semiconductor layer 503 including 150-Å thick n-layer/4,000-Å thick i-layer/100-Å thick p-layer/100-Å thick n-layer/800-Å thick i-layer/100-Å thick p-layer.

As a transparent conductive layer 504, an $In_2O_3$ thin film (with a thickness of 700 Å) was formed by vapor-depositing In in accordance with electrical resistance heating in an $O_2$ atmosphere. Collector electrodes 505 were formed on the transparent conductive layer 504 by pattern-printing a silver paste with a screen printer and drying.

Figure 6:
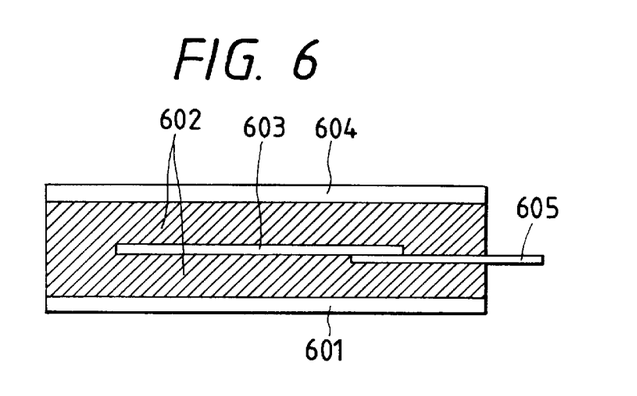
FIG. 6 is a view for explaining the laminating process of the solar cell module according to Example 1 of the present invention.

The process of laminating the solar cell fabricated in the above manner with cover members will be described with reference to FIG. 6. Referring to FIG. 6, reference numeral 601 denotes a lower cover member; 602, a filler; 603, a photovoltaic element; 604, an upper cover member; and 605, a copper foil for electrode extraction.

The lower cover member 601, the filler 602, the photovoltaic element 603 connected to the copper foil 605 for electrode extraction, the filler 602, and the upper cover member 604 were stacked in the order named. The resultant structure was heated at 160° C. in vacuum to fuse the filler, thereby laminating the structure. As the lower cover member, a polyester film (available from ICI, tradename: Melinex #427, 50 μm) was used. As the filler, EVA (ethylene-vinyl acetate copolymer, weather resistant grade, available from BRIDGESTONE CORP, 460 μm) was used. As the upper cover member, a fluoroplastic film (ethylene tetrafluoroethylene, 50-μm thick, available from DAIKIN INDUSTRIES, LTD. tradename: Neoflon EF-0050SB1) was used. After laminating, the resultant structure was t rimmed. During trimming, the four corner portions were cut with a radius of curvature of 50 R.

The solar cell module trimmed as described above was subjected to terminal extraction and edge cover attaching in the following procedure .

First, the internal copper wire of the cable is soldered to the electrode extraction copper foil of the trimmed solar cell module. A bushing (not shown) is fitted in the lead-in cable extraction hole of the fixing member, and the cable is inserted in this bushing.

Figure 7A:
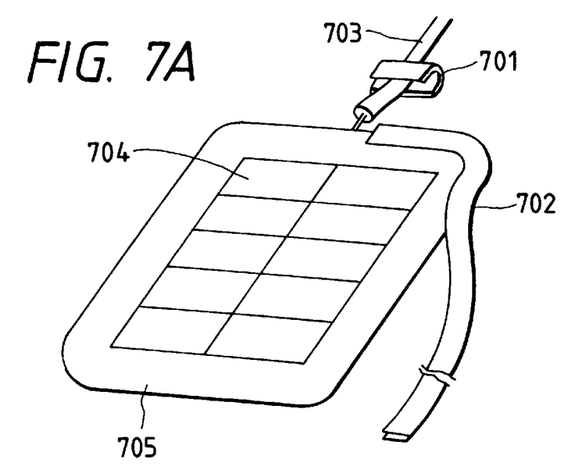
FIGS. 7A, 7B and 7C are views for explaining the operation procedure of extracting a terminal from and attaching an edge protective member to the solar cell module according to Example 1 of the present invention.
Figure 7B:
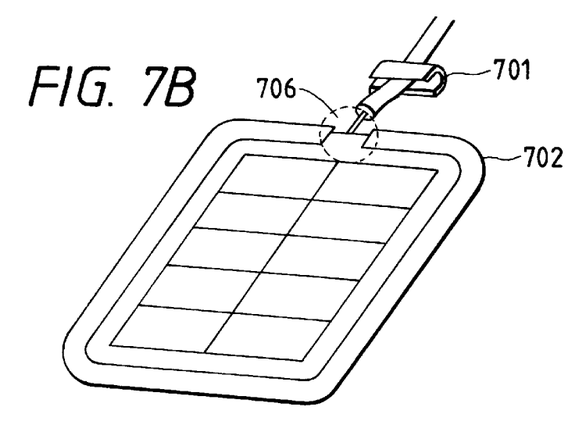
Figure 7C:
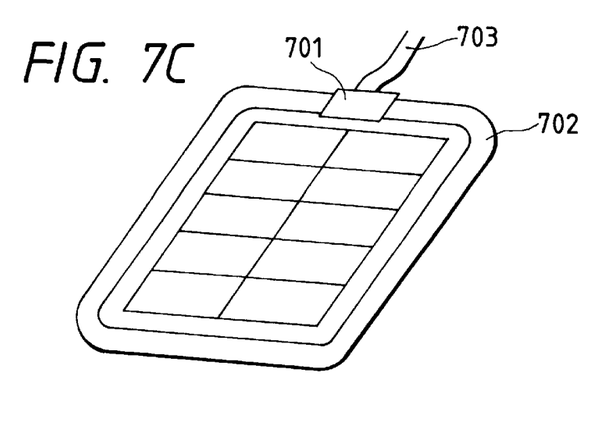

FIGS. 7A, 7B, and 7C are views for explaining the operation procedure of terminal extraction and edge protective member attaching. Reference numeral 701 denotes a fixing member; 702, an edge protective member; 703, a cable; 704, photovoltaic elements; 705, a trimmed solar cell module; and 706, the terminal extraction portion (connecting portions of the edge protective member) of the solar cell module 705. The edge protective member 702 was fitted on the solar cell module 705 starting from the terminal extraction portion 706 of the solar cell module 705, as shown in FIG. 7A, such that only the terminal extraction portion 706 of the solar cell module 705 remained, as shown in FIG. 7B, thereby adjusting the length of the edge protective member 702.

A sealant material was applied to the terminal extraction portion 706 of the solar cell module 705 such that the end portion of the solar cell module 705 and the solder portion of the inner copper foil of the cable and the electrode extraction copper foil of the solar cell module 705 were completely coated. The two end portions of the edge protective member 702 were inserted in the fixing member 701, and the fixing member 701 was fitted on the solar cell module 705, thus fabricating the solar cell module 705 of this example. As the edge protective member 702 and the fixing member 701, ones having sections similar to those shown in FIGS. 1C were used. In this example, as the edge protective member 702 and the fixing member 701, automobile versatile members (available from TOYOTA GOSEI CO., LTD.) were used. As the sealant material, silicone sealant (#739, available from Dow-Corning) was used.

Example 2

Example 2 is different from Example 1 in that, in Example 2, no edge protective member is used, but a fixing member is used only at the terminal extraction portion of the solar cell module, and this fixing member has a terminal extraction structure. Except for this, fabrication of Example 2 is performed in the same manner as in Example 1.

Figure 8A:
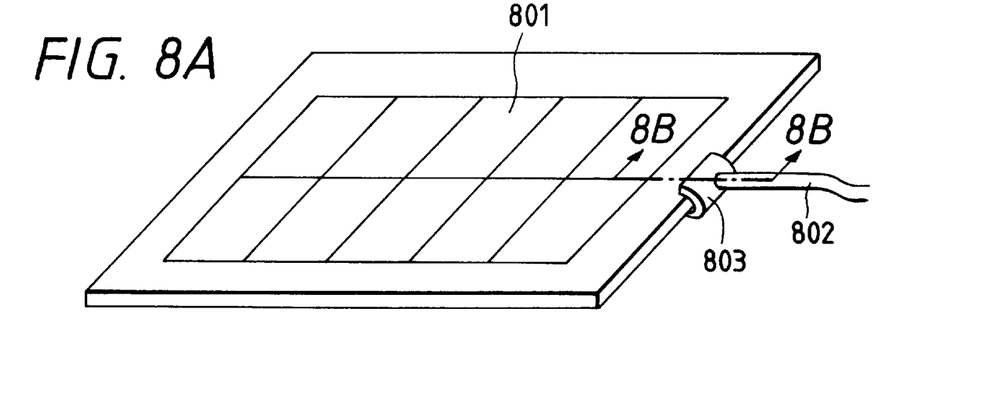
FIG. 8A is a schematic view of a solar cell module according to Example 2.
Figure 8B:
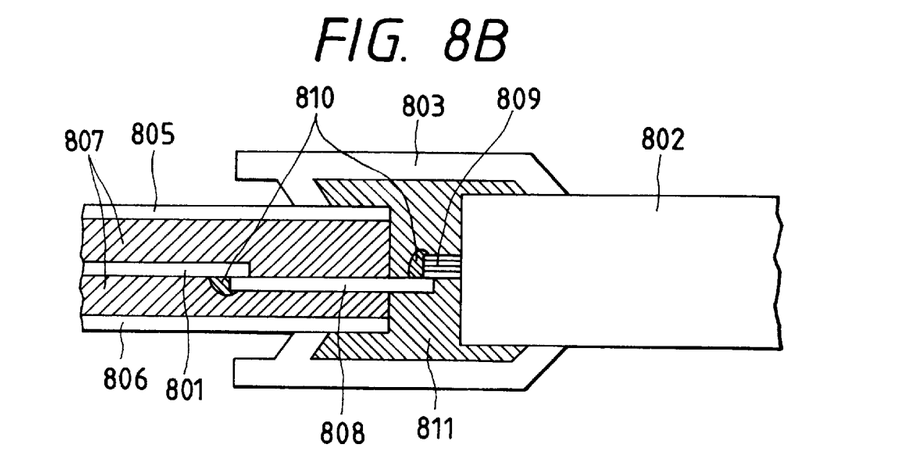
FIG. 8B is a sectional view of the module taken along the line 8B—8B of FIG. 8A.
Figure 8C:
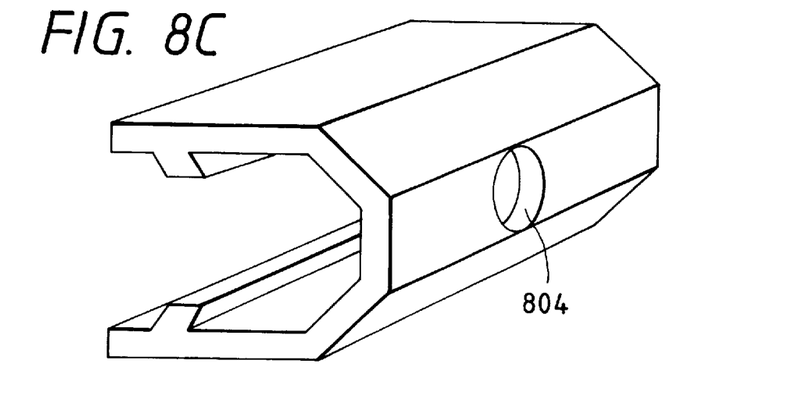
FIG. 8C is a schematic view of a fixing member used in Example 2.

FIGS. 8A to 8C are views for explaining Example 2 of the present invention, in which FIG. 8A is a schematic view of a solar cell module according to Example 2, FIG. 8B is a sectional view of the module taken along the line 8B—8B of FIG. 8A, and FIG. 8C is a schematic view of a fixing member used in Example 2. Referring to FIGS. 8A to 8C, reference numeral 801 denotes photovoltaic elements; 802, a cable; 803, a fixing member; 804, a cable extraction hole; 805, an upper cover member; 806, a lower cover member; 807, a filler; 808, an copper foil for electrode extraction; 809, an in-cable copper wire; 810, solder portions; and 811, a sealant material.

Referring to FIGS. 8A to 8C, the in-cable copper wire 809 was soldered to the copper foil 808 serving as the electrode extraction terminal of the trimmed solar cell module. The cable 802 was inserted in the cable extraction hole 804 of the fixing member 803. The sealant material 811 was applied such that the end portion of the terminal extraction portion of the solar cell module and the solder portion were completely coated. Finally, this fixing member 803 was fitted on the terminal extraction portion of the solar cell module by pushing, thus completing fabrication. Fabrication of Example 2 was performed in the same manner as in Example 1 except for the structure of the terminal extraction portion and except that the edge of the solar cell module was not covered with an edge protective member.

Comparative Example 1

Comparative Example 1 is different from Example 1 in that the terminal is extracted not from the edge of the solar cell module but from the light-receiving surface of the solar cell module. FIG. 10 is a schematic view of a solar cell module as Comparative Example 1. Referring to FIG. 10, reference numeral 1001 denotes an installing surface of a building; 1002, photovoltaic elements; 1003, a cable; 1004, a terminal box; 1005, an edge protective member; and 1006, a fixing member. To extract the terminal, the cover member of the solar cell module on the light-receiving surface was bored so that the cable could be connected to the terminal extraction copper wire of the photovoltaic element 1002.

Thereafter, the copper wire in the lead-in cable was directly soldered to the terminal extraction copper wire of the photovoltaic element 1002. A terminal box was placed on the solder portion to seal it. The interior of the terminal box was filled with a silicone sealant (#739, available from Dow-Corning). Since no lead-in cable was inserted through the fixing member, as the fixing member 1006, one having no cable extraction hole was used. The edge protective member 1005 was fitted in the fixing member 1006. The gap between the edge protective member 1005 and fixing member 1006 was filled with a silicone sealant (#739, available from Dow-Corning). Then, the fixing member 1006 was fitted on the solar cell module, thereby completing fabrication. Except for terminal extraction described above, fabrication of Comparative Example 1 was performed in the same manner as in Example 1.

Comparative Example 2

FIGS. 9A to 9C are schematic views of a solar cell module according to Comparative Example 2, in which FIG. 9A is a schematic view showing a state wherein the solar cell module is fixed to an automobile roof, FIG. 9B is a sectional view of the solar cell module taken along the line 9B—9B of FIG. 9A, and FIG. 9C is a sectional view of the solar cell module taken along the line 9C—9C of FIG. 9A. Referring to FIGS. 9A to 9C, reference numeral 901 denotes an installing surface of a building; 902, photovoltaic elements; 903, a cable; 904, an upper cover member; 905, a lower cover member; 906, a filler; 907, an in-cable copper wire; and 908, a solder portion.

Comparative Example 2 was different from Example 1 in that, in Comparative Example 2, the copper wire in the lead-in cable, which was directly soldered to the photovoltaic element in the solar cell module, was laminated, thus completing fabrication without using an edge protective member or a fixing member. Except for this, fabrication of Comparative Example 2 was performed in the same manner as in Example 1.

(Comparative Testing)

The solar cell modules of the above examples and comparative examples fabricated in the above manner were subjected to comparative tests concerning the following items:

(1) Observation of the outer appearance of the solar cell module after environmental test at 85° C./85% RH for 2,000 hours (2) Rate of decrease in output after a cycle of light radiation and rain The solar cell module was placed in the sunshine weather (SW) tester. Accelerated test was performed with the cycle of light radiation and rain, and an output after 5,000 hours was measured. The rate of decrease in output after the accelerated test to the initial output was calculated.

(Result and Consideration of Comparative Test)

Table 1 shows the test results of the solar cell modules according to the above examples and comparative examples.

TABLE 1

Comparative Test Result

|  | Observation of Outer Appearance After Accelerated Test | Rate of Decrease in Output After SW Test |
|---|---|---|
| Example 1 | No change | ▲1.0% |
| Example 2 | No change | ▲0.5% |
| Comparative Example 1 | J-Box peels from outermost upper cover member | ▲2.0% |
| Comparative Example 2 | Cover member peels largely at terminal extraction portion | ▲10% |

(1) Accelerated Test at 85° C./85% RH

The outer appearance inspection performed 2,000 hours after the accelerated test at 85° C./85% RH shows that the solar cell modules of Examples did not change. In Comparative Example 2, the covering member partly constituting the solar cell module peels.

In the samples of Examples, since the edge protective member clamps the solar cell module, peeling of the cover member does not occur at all at the end portion of the solar cell module. Even if peeling should occur, the edge protective member suppresses progress of peeling. In contrast to this, in the sample of Comparative Example 2, peeling of the cover member occurs at the following cause. The cover member partly constituting the solar cell module tries to enclose the lead-in cable at the terminal extraction portion. When a large stress of stretching or shrinkage acts on the cover member, the stress remains in the cover member. The cover member tries to restore to the original state in the accelerated test, thus causing peeling. In Comparative Example 1, the terminal box peels from the upper cover member. This may be because the terminal box is adhered to a fluorine film (upper cover member) which is difficult to adhere.

(2) Rate of Decrease in Output after Sunshine Weather Meter Test (Cyle of Light Radiation and Rain)

The rate of decrease in output is the highest in Comparative Example 2. This may be caused by the following cause. The copper wire in the lead-in cable is directly soldered to the photovoltaic element of the solar cell module. The moisture that has entered the lead-in cable during the environmental test reaches the interior of the solar cell module along the interface between the insulated cover portion and the copper wire portion in the lead-in cable, and influences the photovoltaic element.

According to the present invention, the weather resistance of the terminal box is improved. Simultaneously, since no projection extends from the upper surface of the solar cell module, the solar cell module is not easily damaged. Also, since no projection extends from the lower surface of the solar cell module, the solar cell module can be easily installed on the roof of a building structure, automobile, or the like.

Since the edge protective member clamps the end portion of the solar cell module and the fixing member or edge protective member has a terminal extraction structure, even if the solar cell module is installed outdoors, the cover member does not peel easily. Even if peeling should occur, progress of peeling can be suppressed since the edge protective member clamps the cover member.

What is claimed is:

1. A solar cell module comprising:

a photovoltaic element;

a cover member covering said photovoltaic element;

a terminal exposed from the periphery of said solar cell module for extracting the power outputted from said photovoltaic element;

a cable having a lead-in portion comprising a conductive member which is electrically connected to said terminal; and a fixing member (a) housing therein (i) the lead-in portion of said cable including an electrical connecting portion of said conductive member and (ii) said terminal and (b) fixing said lead-in portion to said solar cell module, wherein said fixing member is formed of a single member and sandwiches the opposite surfaces of said solar cell module.

2. A module according to claim 1, wherein said fixing member is made of a resin or rubber.

3. A module according to claim 1, wherein said fixing member has a weather protection structure.

4. A module according to claim 1, wherein an interior of said fixing member is filled with a sealant.

5. A module according to claim 1, further having an edge protective member on an edge of said solar cell module.

6. A module according to claim 5, wherein said edge protective member has a wire in a longitudinal direction thereof and/or a direction perpendicular to the longitudinal direction.

7. A module according to claim 5, wherein said edge protective member is made of a resin or rubber.

8. A module according to claim 5, wherein an interior of said edge protective member is filled with a sealant.

9. A module according to claim 1, wherein said cover member is made of at least a transparent resin and/or a transparent film.

10. A module according to claim 1, further having a reinforcing plate on a non-light-receiving surface thereof.

11. A module according to claim 1, wherein said photovoltaic element each have a non-single-crystal semiconductor.

12. A module according to claim 1, wherein said solar cell module has flexibility.

13. A module according to claim 1, further having a double-coated tape, an adhesive, or a magnet on a lower surface of said solar cell module.

14. A module according to claim 1, wherein said cover member has a transparent resin, and a magnet is buried in said transparent resin.

15. A method of manufacturing a solar cell module, comprising the steps of:

electrically connecting a cable and a terminal exposed from an edge of said solar cell module to extract power generated by a photovoltaic element; and fixing said cable and said solar cell module with a fixing member so as to cover portion where said terminal and said cable are electrically connected.

16. A method according to claim 15, further comprising the step of arranging an edge protective member on an edge of said solar cell module.

17. A method according to claim 15, further comprising the step of filling an interior of said fixing member with a sealant.

* * * * *

UNITED STATES PATENT AND TRADEMARK OFFICE
CERTIFICATE OF CORRECTION

PATENT NO.   : 6,066,796
DATED        : May 23, 2000
INVENTOR(S)  : SHIGENORI ITOYAMA ET AL.          Page 1 of 3

It is certified that error appears in the above-identified patent and that said Letters Patent is hereby corrected as shown below:

COLUMN 1:

Line 18, "an" should read --a--.

COLUMN 3:

Line 62, "As far as" should read --As long as--.

COLUMN 4:

Line 2, "FIG. 4A" should read --FIG. 4B--; and
   Line 5, "FIG. 41." should read --FIG. 4B--.

COLUMN 5:

Line 19, "farther" should read --the farther--.

COLUMN 6:

Line 45, "Th e" should read --The--;
   Line 52, "SiH$_4$a PH$_3$," should read --SiH$_4$, PH$_3$,--; and
   Line 55, "including" should read --including a--.

COLUMN 7:

Line 16, "t rimmed." should read --trimmed.--.

COLUMN 8:

Line 8, "an" should read --a--.

UNITED STATES PATENT AND TRADEMARK OFFICE
CERTIFICATE OF CORRECTION

PATENT NO. : 6,066,796

DATED : May 23, 2000

INVENTOR(S) : SHIGENORI ITOYAMA ET AL.

It is certified that error appears in the above-identified patent and that said Letters Patent is hereby corrected as shown below:

COLUMN 9:

Line 48, "Examples" should read --the Examples--;
    Line 55, "progress of peeling" should read --the rate of peeling--; and
    Line 57, "following cause." should read --terminal extraction portion. This may be caused by the following cause.--.

COLUMN 10:

Line 2, "(Cyle" should read --(Cycle--; and
    Line 26, "progress" should read --the rate--.

UNITED STATES PATENT AND TRADEMARK OFFICE
CERTIFICATE OF CORRECTION

PATENT NO.    : 6,066,796
DATED         : May 23, 2000
INVENTOR(S)   : SHIGENORI ITOYAMA ET AL.          Page 3 of 3

It is certified that error appears in the above-identified patent and that said Letters Patent is hereby corrected as shown below:

COLUMN 11:

Line 4, "element each have" should read --element has--.

Signed and Sealed this

Twenty-fourth Day of April, 2001

Attest:

NICHOLAS P. GODICI

Attesting Officer    Acting Director of the United States Patent and Trademark Office